US008030996B1

(12) United States Patent
Prado

(10) Patent No.: US 8,030,996 B1
(45) Date of Patent: Oct. 4, 2011

(54) APPARATUS AND METHOD FOR AUTOMATIC LEVEL CONTROL

(75) Inventor: Jose Prado, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/572,972

(22) Filed: Oct. 2, 2009

(51) Int. Cl.
*H03G 3/20* (2006.01)
(52) U.S. Cl. .................................. 330/144; 330/284
(58) Field of Classification Search .............. 330/144, 330/145, 284
See application file for complete search history.

(56) References Cited

U.S. PATENT DOCUMENTS
7,719,339 B2 * 5/2010 Romani ........................ 327/321

OTHER PUBLICATIONS

Product Brief "Mono Class D Audio Subsystem with Earpiece Driver, Ground Referenced Headphone Amplifiers, Speaker Protection and No Clip with Clip Control", Apr. 16, 2009, 4 pages.

* cited by examiner

*Primary Examiner* — Steven J Mottola
(74) *Attorney, Agent, or Firm* — Frommer Lawrence & Haug LLP; Matthew M. Gaffney

(57) ABSTRACT

A circuit and method for automatic level control is provided. The circuit includes an amplifier including a variable resistance circuit that is connected between a first node and a second node. The circuit also includes a first resistance circuit that is connected between a first input node and the first node, and a second resistance circuit that is connected between the first input node and a first op amp node. The first and second resistance circuits are at least approximately linear elements. The circuit also includes an op amp having at least a first input that is connected to the first op amp input node.

19 Claims, 11 Drawing Sheets

APPARATUS AND METHOD FOR AUTOMATIC LEVEL CONTROL

FIELD OF THE INVENTION

The invention is related to automatic level control, and in particular, to an apparatus and method for a low distortion automatic level control for an audio amplifier.

BACKGROUND OF THE INVENTION

In audio applications, a power amplifier is usually incorporated to drive a speaker load. The speaker load value typically varies from 4 ohm to 32 ohm. Traditionally, class AB amplifiers have been used to drive the speaker load.

The main drawback of using class AB amplifiers is low efficiency. Low efficiency translates into more power dissipation inside the amplifier which in turn mandates using a (larger) heat sink to dissipate the heat and also lowers the battery life or necessitates a larger and more expensive power supply. This increases the cost and the area of the audio solution.

A class-D amplifier is attractive because of the higher power efficiency compared to a class AB amplifier, which realizes a longer battery life and eliminates the heat sink requirement. This allows design of compact and low cost multi-channel high-power systems. The class D amplifiers partially mitigate the concern of thermal runaway by using transistors as switches.

Class D amplifiers typically employ either pulse-width modulation, pulse density modulation, or sigma-delta modulation. The relatively high frequency carrier signal is modulated by the relatively low frequency audio input signal.

BRIEF DESCRIPTION OF THE DRAWINGS

Non-limiting and non-exhaustive embodiments of the present invention are described with reference to the following drawings, in which.

DETAILED DESCRIPTION

Figure 1:
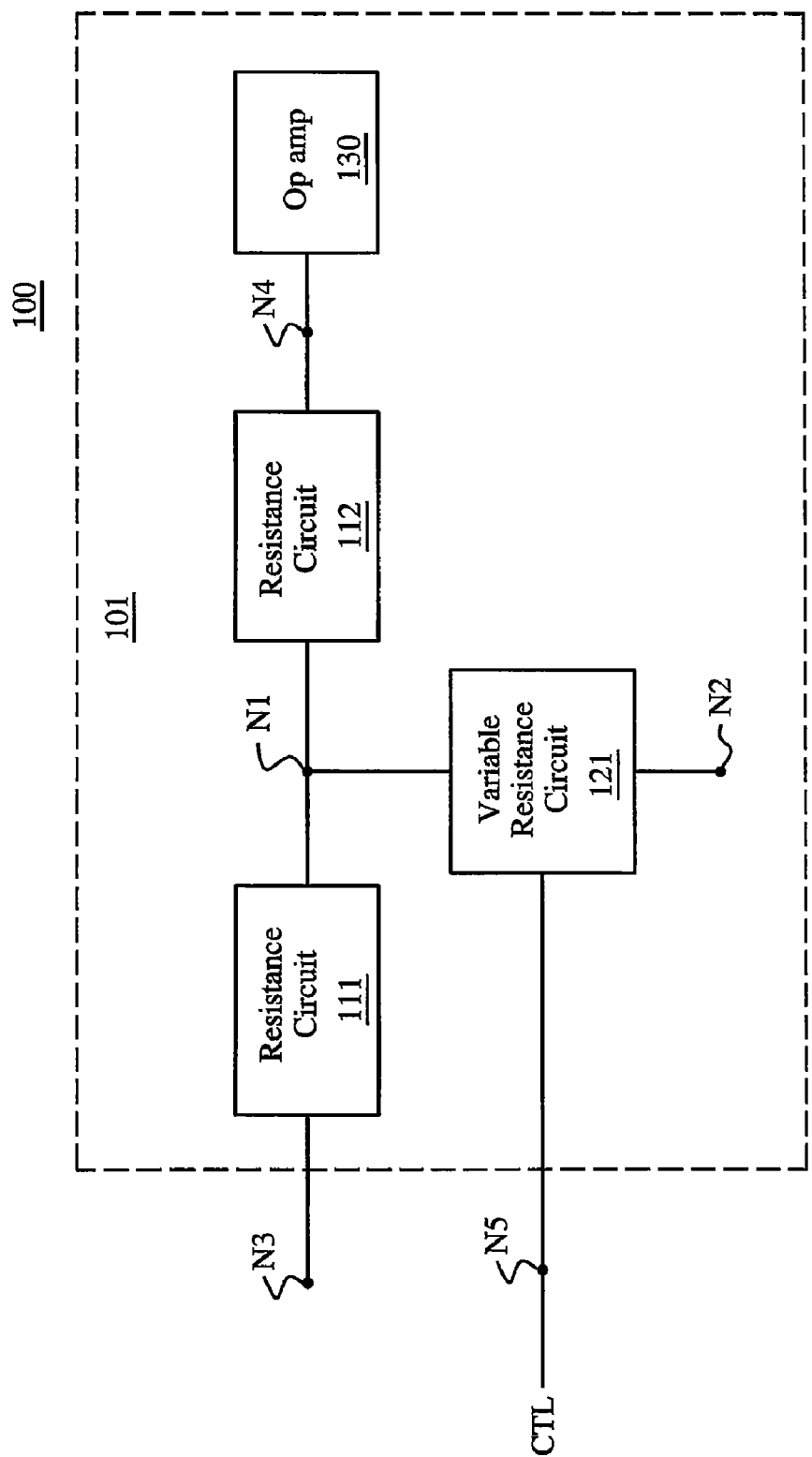
FIG. 1 illustrates a block diagram of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a circuit and method for automatic level control. The circuit includes an amplifier including a variable resistance circuit that is connected between a first node and a second node. The circuit also includes a first resistance circuit that is connected between a first input node and the first node, and a second resistance circuit that is connected between the first input node and a first op amp node. The first and second resistance circuits are at least approximately linear elements. The circuit also includes an op amp having at least a first input that is connected to the first op amp input node.

FIG. 1 illustrates a block diagram of an embodiment of circuit 100. Circuit 100 includes amplifier 101. Amplifier 101 is a variable gain amplifier in which the gain is controlled by control signal CTL. In some embodiment, control signal CTL is a voltage, and amplifier 101 is a voltage controlled amplifier (VCA). In other embodiments, signal CTL is a type of signal other than a voltage, such as a current.

Amplifier 101 includes resistance circuit 111, resistance circuit 112, variable resistance circuit 121, and op amp 130. As shown in FIG. 1, variable resistance circuit 121 is coupled between node N1 and node N2. A control input of variable resistance circuit 121 is coupled to node N5. First resistance circuit 111 is coupled between node N1 and node N3. Second resistance circuit 112 is coupled between node N1 and node N4. Op amp 130 has at least a first input that is coupled to node N4.

Variable resistance circuit 121 is arranged to provide a variable resistance between node N1 and node N2, such that the resistance between nodes N1 and N2 varies based on signal CTL provided at node N5. In some embodiments, variable resistance circuit 121 is approximately a linear element. For example, in some embodiments, variable resistance circuit 121 consists of one or more MOSFETs biased to operate in the triode region of operation. In some embodiment, node N2 is coupled to a fixed voltage, or the like.

First resistance circuit 111 is arranged to provide a first fixed equivalent resistance between nodes N3 and N1. First resistance 111 may be a linear element, or approximately a linear element. In one embodiment, resistance circuit 111 consists of a single resistor connected between node N1 and N3. The term "equivalent resistance" is understood to encompass the resistance of the resistor in this case, so that the "equivalent resistance" is the actual resistance in the case where the resistance circuit consists of exactly one resistor. In other embodiments, resistance circuit 111 may include one or more resistors coupled together in series and/or in parallel to provide an equivalent resistance. In other embodiments, resistance circuit 111 may be a transistor bias to operate substantially as a resistor with a fixed resistance.

Second resistance circuit 112 is arranged to provide a second equivalent resistance between nodes N1 and N4. Like first resistance circuit 111, second resistance circuit 112 may consist of one resistor, two or more resistors coupled together in series and/or in parallel, or the like.

Figure 2:
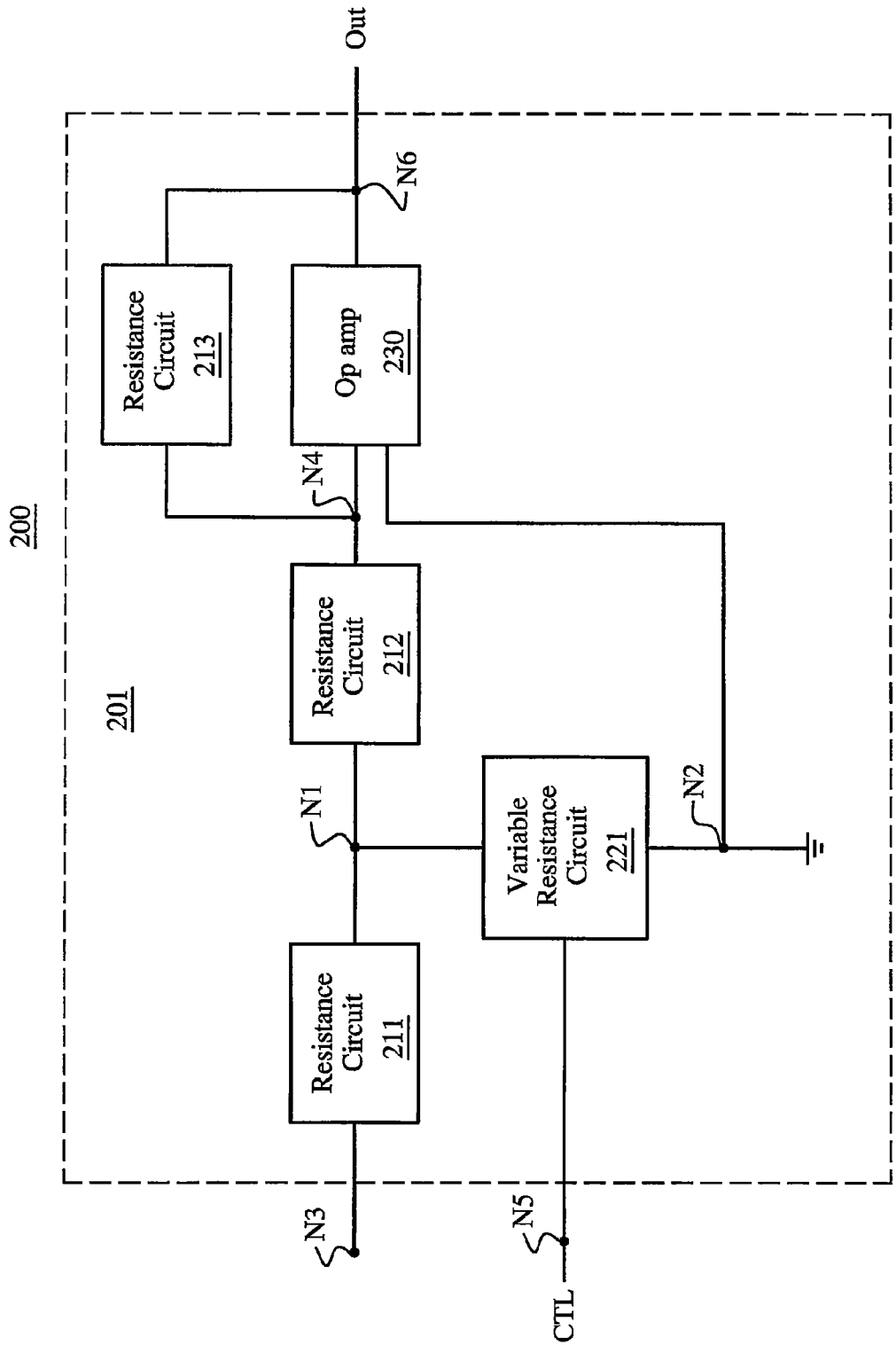
FIG. 2 shows a block diagram of an embodiment of the circuit of FIG. 1.

FIG. 2 shows a block diagram of circuit 200, which may be employed as an embodiment of circuit 100 of FIG. 1. Amplifier 201 further includes resistance circuit 213, which is coupled between nodes N4 and N6. Op amp 230 includes a second input that is coupled to node N2, and an output that is coupled to node N6. Amplifier 200 is arranged to provide amplifier output signal Out, which is based at least in part on the output of op amp 230. Node N2 is coupled to a fixed voltage, such as ground or the like.

Figure 3:
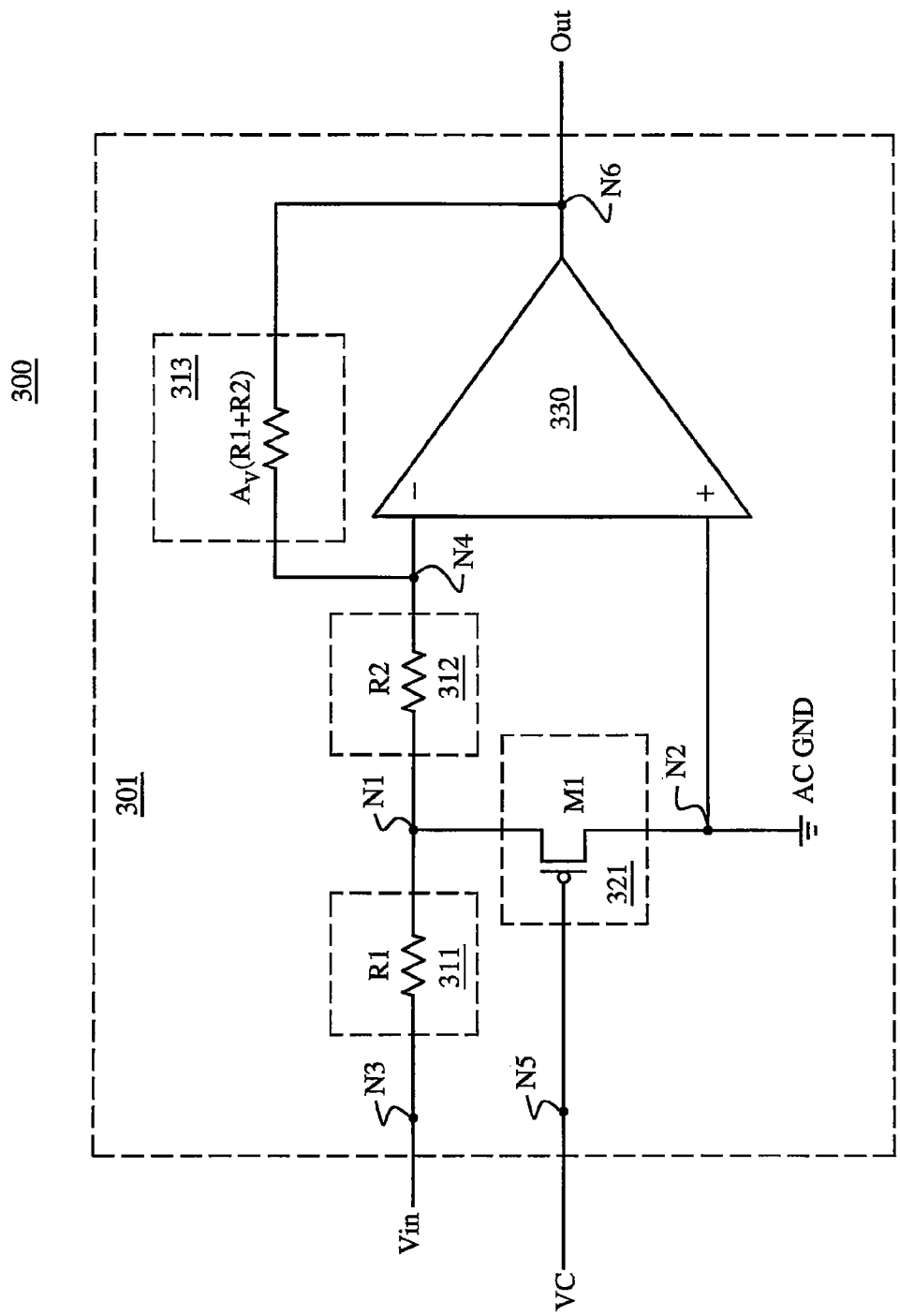
FIG. 3 schematically illustrates an embodiment of the circuit of FIG. 2.

FIG. 3 schematically illustrates an embodiment of circuit 300, which may be employed as an embodiment of circuit 200 of FIG. 2. Op amp 330 has a non-inverting input coupled to node N2, an inverting input coupled to node N4, and an output coupled to node N6. Amplifier 301 is arranged to receive amplifier input voltage Vin at node N3, and to provide amplifier output signal Out at node N6. Variable resistance circuit 321 includes transistor M1, which is biased to operate in the triode region of operation. Resistance circuit 311 includes a resistor having a resistance R1. Resistance circuit 312 includes a resistor having a resistance R2. Resistance circuit 313 includes a resistor having a resistance $A_V*(R1+R2)$, where $A_V$ is the unmodified voltage gain of amplifier 301 (i.e., the voltage gain when transistor M1 is substantially an open circuit). Control voltage VC is an embodiment of control signal CTL.

In the embodiment shown, node N2 is coupled to AC ground. However, in other embodiments, it may be some other DC potential. For example, in some embodiments, VSS=0V, and the voltage at node N2 is VDD/2.

Amplifier 301 has a gain that varies based on control voltage VC. When equivalent resistance across variable resistance circuit 321 is large, so that it is approximately an open circuit, there is no attenuation, and the gain of amplifier 130 is $A_V$. The lower the resistance across variable resistance circuit 321, the greater than attenuation, and the smaller the total gain provided by amplifier 301.

Figure 4:
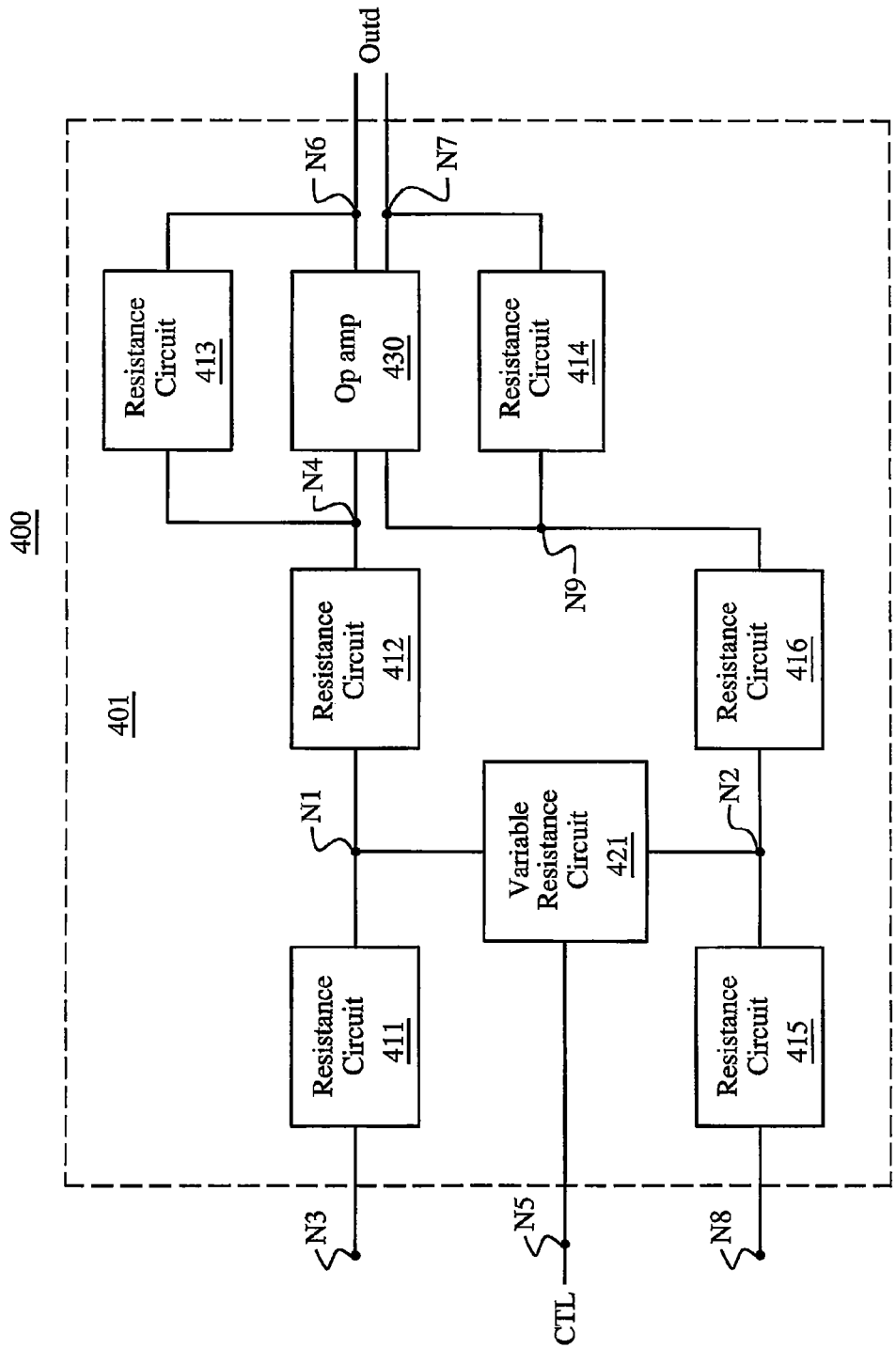
FIG. 4 shows a block diagram of a differential embodiment of the circuit of FIG. 2.

FIG. 4 shows a block diagram of an embodiment of circuit 400, which may be employed as an embodiment of circuit 200 of FIG. 2. Amplifier 401 is arranged to provide differential output signal Outd. Op amp 430 includes a first input that is coupled to node N4, a second input that is coupled to node N9, and first output that is coupled to node N6, and a second output that is coupled to node N7. Circuit 200 further includes resistance circuit 414 coupled between node N7 and node N9, resistance circuit 415 coupled between node N8 and node N2, and resistance circuit 416 coupled between node N2 and node N9. As previously discussed, in some embodiments, control signal CTL is a control voltage, and amplifier 401 is a voltage controlled amplifier (VCA).

Figure 5:
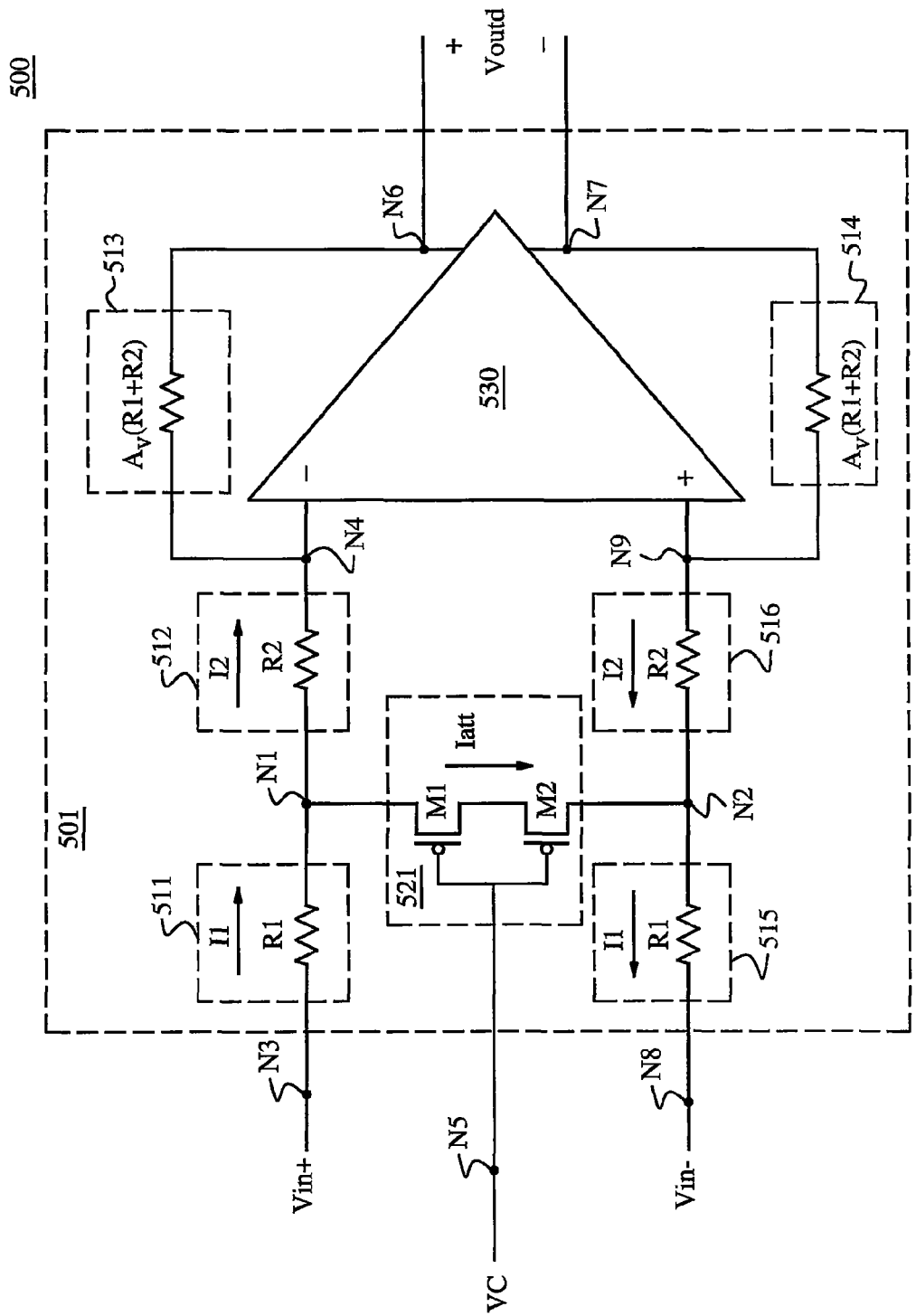
FIG. 5 schematically illustrates an embodiment of the circuit of FIG. 4.

FIG. 5 schematically illustrates an embodiment of circuit 500, which may be employed as an embodiment of circuit 400 of FIG. 4. Amplifier 501 is arranged to receive amplifier differential input voltage Vin+/Vin− across nodes N3 and N8, and to provide amplifier output voltage Voutd across nodes N6 and N7. Amplifier output voltage Voutd is an embodiment of amplifier output signal Out. Amplifier output voltage Voutd is a differential voltage that includes voltage Voutp at node N6 and Voutn at node N7. Variable resistance circuit 521 includes transistors M1 and M2, which are each biased to operate in the triode region of operation. Resistance circuits 511 and 515 each include a resistor having a resistance R1. Resistance circuits 512 and 516 each include a resistor having a resistance R2. Resistance circuits 513 and 514 each include a resistor having a resistance $A_V*(R1+R2)$, where $A_V$ is the unmodified voltage gain of amplifier 501.

Variable resistance circuit 521 provides a variable resistance $2*R_{M1}$ between nodes N1 and N2, where the equivalent resistance across resistance of transistor $M1=R_{M1}$, and where the equivalent resistance across transistor M2 is also substantially equal to $R_{M1}$. The variable resistance $2*R_{M1}$ has an attenuating effect on the amplifier output Voutd. Current Iatt is directly proportional to Vin+, and inversely proportional to $R_{M1}$. Current Iatt shunts current from R2. As $R_{M1}$ increases in value, Iatt approaches zero. As $R_{M1}$ approaches infinity, Iatt approaches zero such that I1=I2 (No attenuation). As $R_{M1}$ decreases in value Iatt approaches I1. As $R_{M1}$ approaches zero, I2 approaches zero such that Iatt=I1 (full attenuation). Voltage Voutp=$A_V$I2(R1+R2) and Voutn=$-A_V$I2(R1+R2). Current Iatt=Vin+/[R1+(R1+R2)*$R_{M1}$/R2]. The total attenuation is $1/(1+[m/(m+1)]*[R2/R_{M1}])$, where m=R1/R2.

Transistors M1 and M2 are MOS transistors biased to operate in the triode region of operation. Accordingly, $I_{PMOS(triode)}=\rho_p*[(V_{SG}-|V_{thp}|)*V_{SD}-V_{SD}^2]$. $V_{SD}$ is preferably very small to ensure linearly is achieved (signal integrity). For audio applications, the smaller $V_{SD}$, the lower the amount of distortion introduced by the transistor. If this approach is taken, then, $I_{PMOS(triode)}=\beta_p*[(V_{SG}-|V_{thp}|)*V_{SD}]$. According, $R_{PMOS}=V_{SD}/I_{PMOS}=1/[\beta_p*(V_{SG}-|V_{thp}|)]$. From this equation, the resistance $R_{PMOS}$ can be changed if the parameters $\beta_p$, $|V_{thp}|$, or $V_{SG}$ are changed. Since $\beta_p$ and $|V_{thp}|$ are process parameters that are not changed, this leaves $V_{SG}$ as the lone variable that can be adjusted to either increase or decrease the equivalent resistance $R_{PMOS}$.

Figure 6:
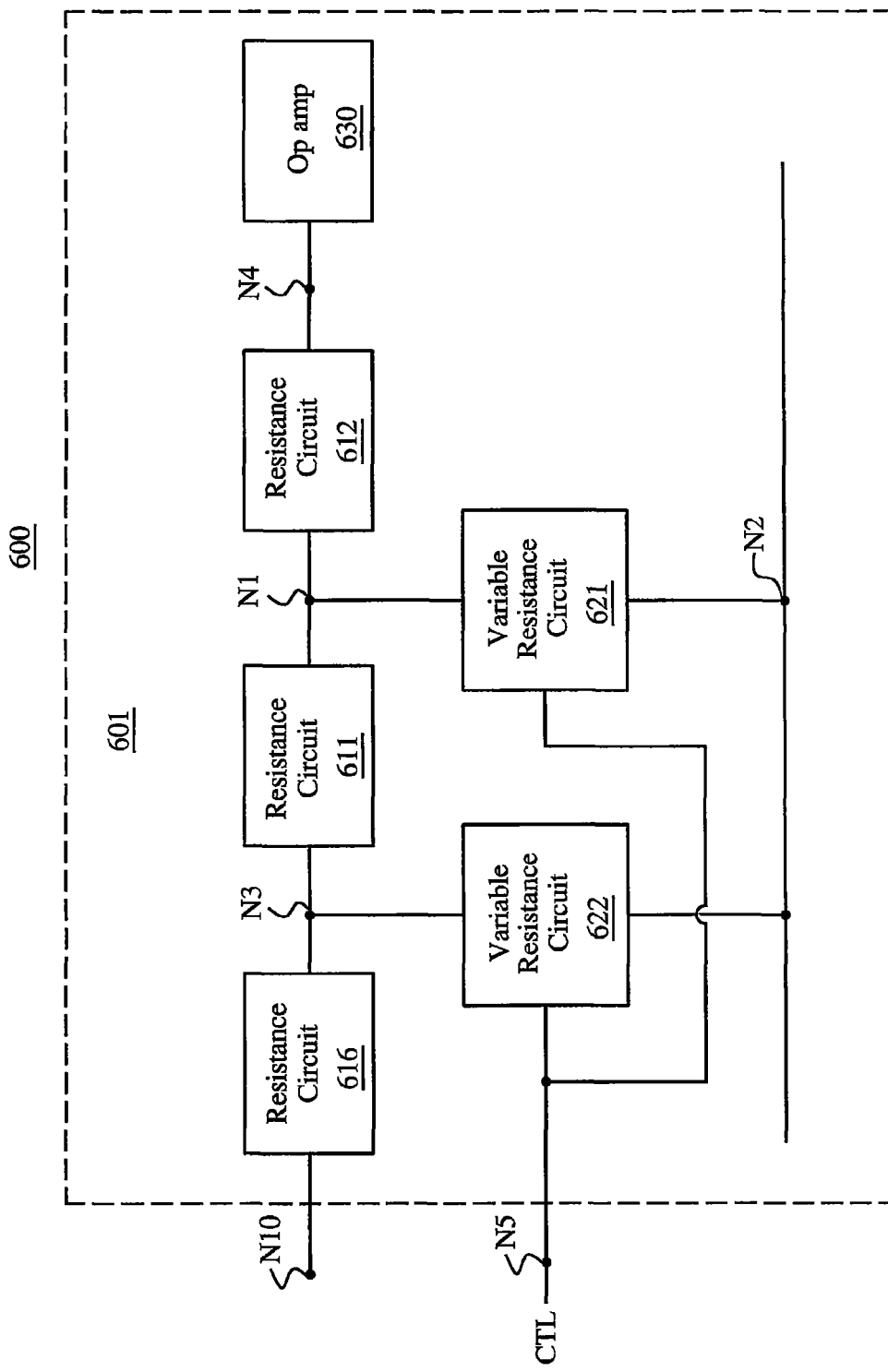
FIG. 6 shows a block diagram of another embodiment of the circuit of FIG. 1.

FIG. 6 shows a block diagram of an embodiment of circuit 600, which may be employed as an embodiment of circuit 100 of FIG. 1. Amplifier 601 further includes resistance circuit 616 and variable resistance circuit 622.

Figure 7:
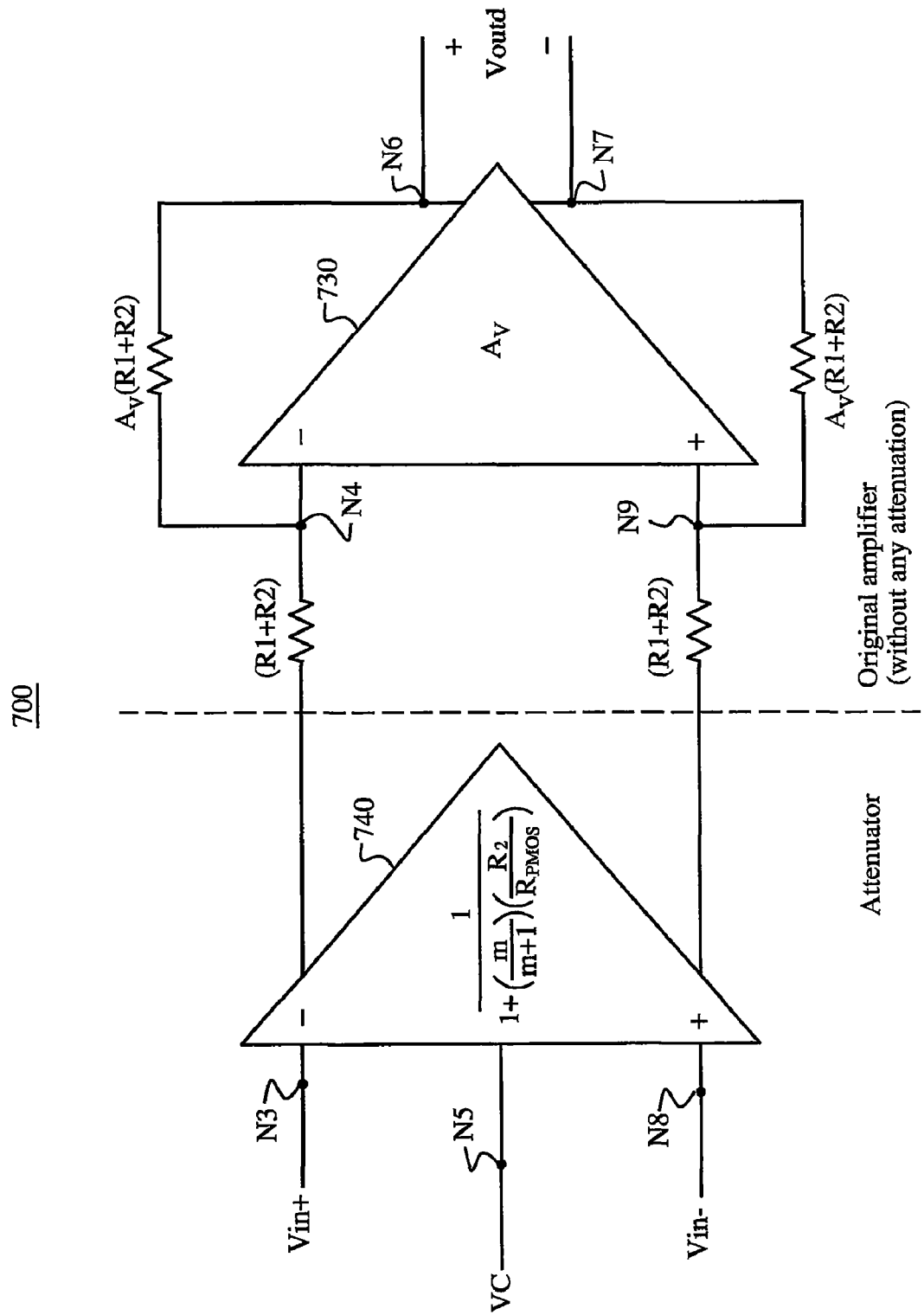
FIG. 7 illustrates a functional block diagram of an embodiment of the circuit of FIG. 5.

FIG. 7 illustrates a functional block diagram of an embodiment of circuit 700, which may be employed as an embodiment of circuit 500 of FIG. 5. FIG. 7 illustrates that circuit 500 may be shown functionally as a combination of an amplifier having a voltage gain $A_V$ and an attenuator having a gain of $1/(1+[m/(m+1)]*[R2/R_{PMOS}])$, where $R_{PMOS}$ is adjusted by adjusted control voltage VC.

Figure 8:
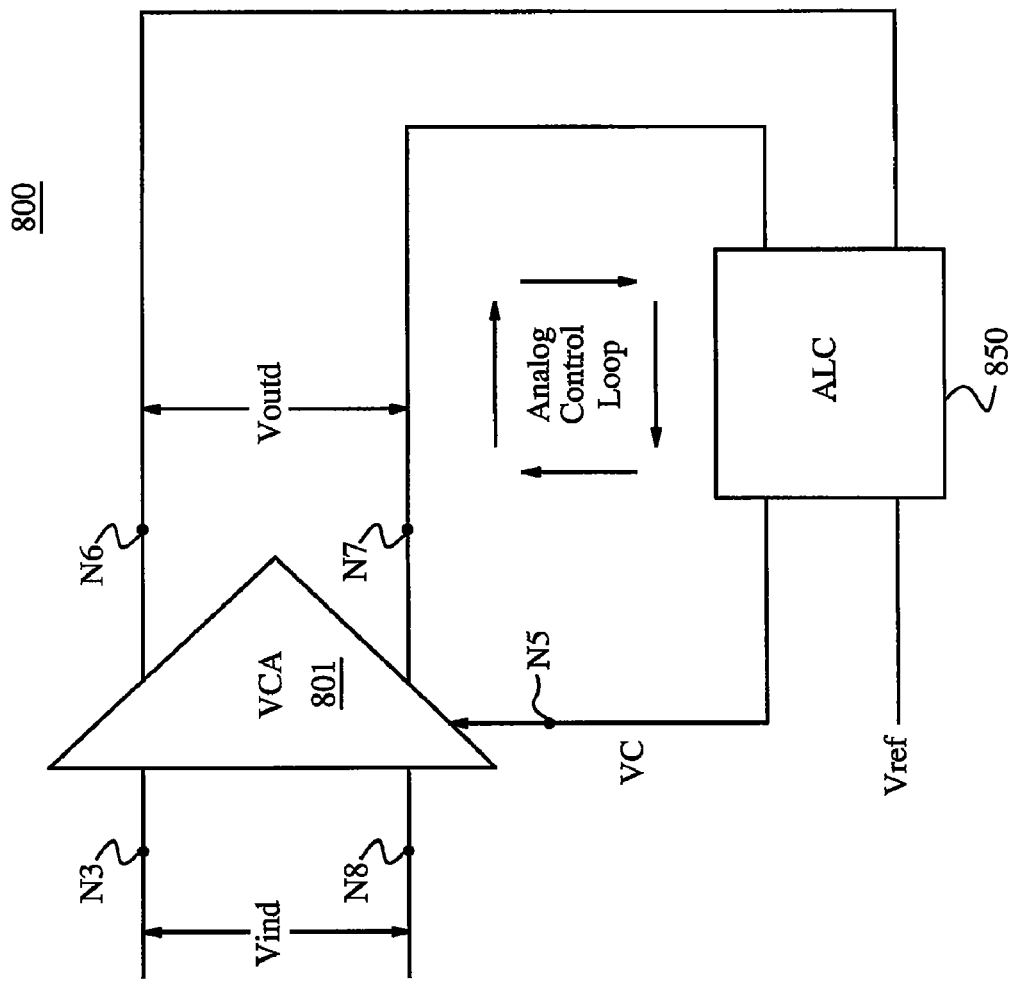
FIG. 8 shows a block diagram of an embodiment of the circuit of FIG. 4 that includes an automatic level control circuit.

FIG. 8 shows a block diagram of an embodiment of circuit 800, which may be employed as an embodiment of circuit 400 of FIG. 4. Circuit 800 further includes automatic level control circuit (ALC) 850.

ALC 850 is arranged to receive differential output voltage Voutd and reference voltage Vref, and to provide control voltage VC. ALC 850 is arranged to automatically reduce the gain of VCA 801 (via control voltage VC) to provide differential output voltage Voutd from exceeding a predetermined level.

In some embodiment, differential input signal Vin is an audio input signal, and differential output voltage Voutd is provided to an audio power amplifier, such as a class D audio power amplifier, class AB audio power amplifier, or the like. In other embodiments, circuit 800 is used in other applications.

ALC 850 is arranged to monitor amplifier output voltage Voutd and make an adjustment to the signal path gain whenever amplifier output voltage Voutd exceeds a reference level associated with reference voltage Vref. If amplifier output voltage Voutd remains below the reference level, the signal path gain is not changed. However, if the Voutd exceeds the reference level, the signal path gain is attenuated by ALC 850.

In audio applications, it is preferable to ensure that both linearity (as measured by total harmonic distortion [THD]) and sound quality are minimally affected by the signal path gain attenuation. By using MOS transistors arranged in the triode operation, and modulating the resistance of the MOS transistors by controlling the control voltage VC at their gates and biased appropriately, as previously discussed, the linearity needed to keep distortion low and maintain good audio quality is provided. Further, circuit 800 provides a low distortion voltage-controlled amplifier that is controlled via an analog control loop, rather than employing a digital gain step, thereby allowing lower costs and less design complexity.

Figure 9:
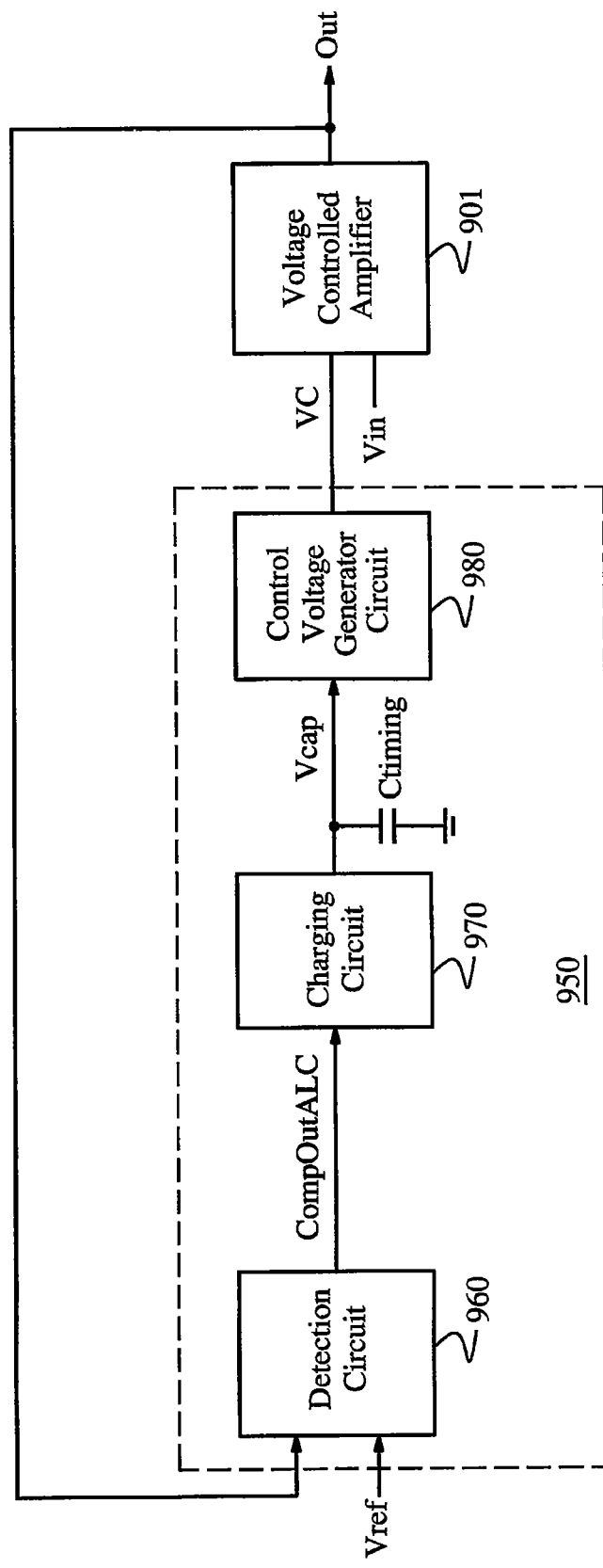
FIG. 9 illustrates a block diagram of an embodiment of the circuit of FIG. 8.

FIG. 9 illustrates a block diagram of an embodiment of circuit 900, which may be employed as an embodiment of circuit 800 of FIG. 8. ALC 950 includes detection circuit 960, charging circuit 970, timing capacitor Ctiming, and control voltage generator circuit 980. Voltage controlled amplifier 901 is arranged to provide amplifier output signal Out from amplifier input voltage Vin, where the gain is adjusted based on control voltage VC. Amplifier input voltage Vin may be either single-ended or differential, and amplifier output signal Out may be either single-ended or differential.

Detection circuit 960 is arranged to determine whether output signal Out exceeds a reference level, and is further arranged to assert detection output signal compOutALC if the determination is positive. In embodiments in which amplifier output signal Out is single-ended, detection circuit 960 may consist of a comparator comparing amplifier output signal Out to the reference level. In embodiments in which amplifier output signal Out is differential, detection circuit 960 may first full-wave rectify amplifier output signal Out.

Charging circuit 970 is arranged to receive signal compOutALC, and is arranged to control charging of timing capacitor Ctiming such that timing capacitor voltage Vcap ramps when signal compOutALC is asserted. Control voltage generator circuit 980 is arranged to provide control voltage VC based on timing capacitor voltage Vcap. Among other things, control voltage generator circuit 980 performs level-shifting, and ensures that control voltage VC does not cause voltage attenuation when compOutALC has not been asserted, but that attenuation begins once compOutALC has been asserted. Control voltage generator circuit 980 may more generically be referred to as a control signal generator circuit, since, as previously discussed, in some embodiment the control signal may be a voltage, and in other embodiment, the control signal may be another type of signal, such as a current.

Figure 10:
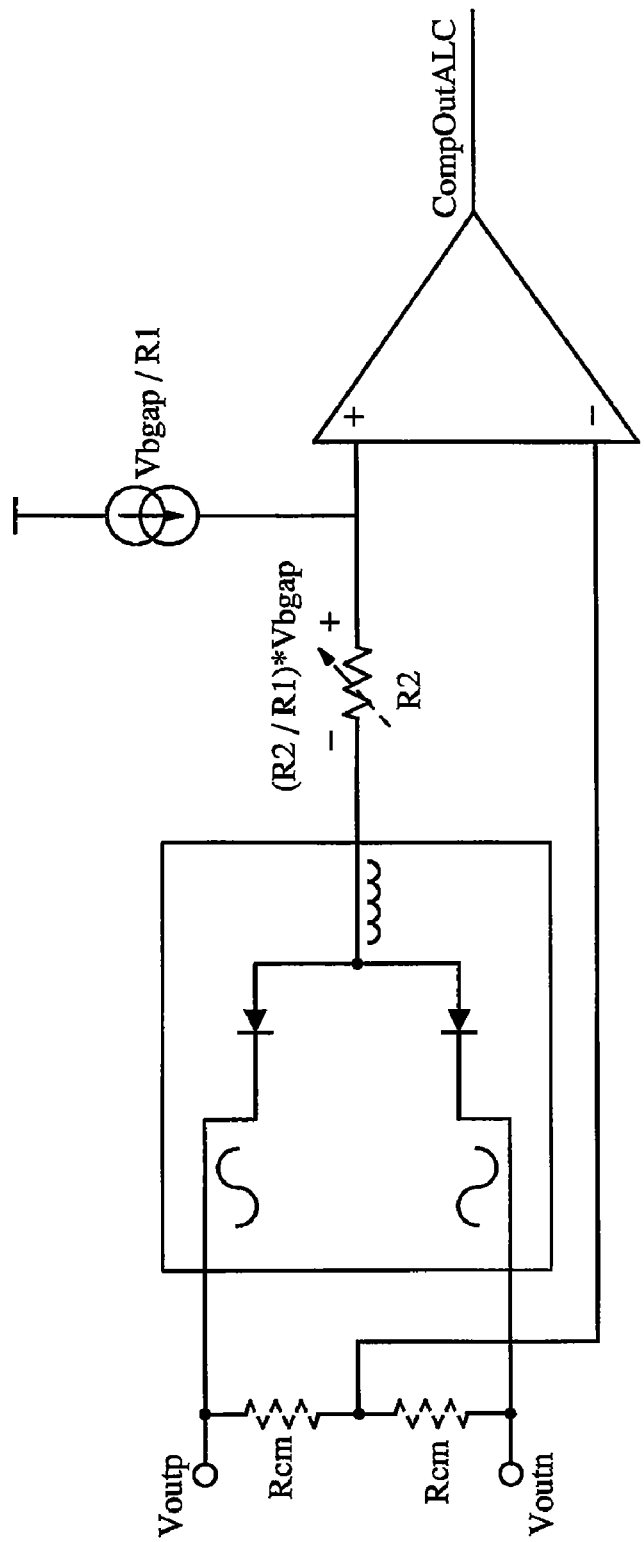
FIG. 10 shows a schematic diagram of an embodiment of the detection circuit of FIG. 9.

FIG. 10 shows a schematic diagram of an embodiment of detection circuit 1060, which may be employed as an embodiment of detection circuit 960 of FIG. 9. Detection circuit 1060 provides a bandgap voltage across a resistor R1 to provide a current Vbgap/R1, and provides current Vbgap/R1 to resistor R2, to provide a voltage (R2/R1)*Vbgap. This allows a reference level (R2/R1)*Vbgap+VDD/2 to be defined, for comparison to the different output voltage Voutd. Differential output voltage Voutd includes Voutp and Voutn. Detection circuit 1060 full-wave rectifies output voltage Voutd, offsets the full-wave rectified output voltage by (R2/R1)*Vbgap, and compares the offset full-wave rectified output voltage with the common node voltage of Voutp and Voutn (which is Vdd/2) to provide signal compOutALC. This effectively compares the full-wave rectified output voltage with the reference level (R2/R1)*Vbgap+VDD/2 to provide signal compOutALC, but does so with only one comparator.

Figure 11:
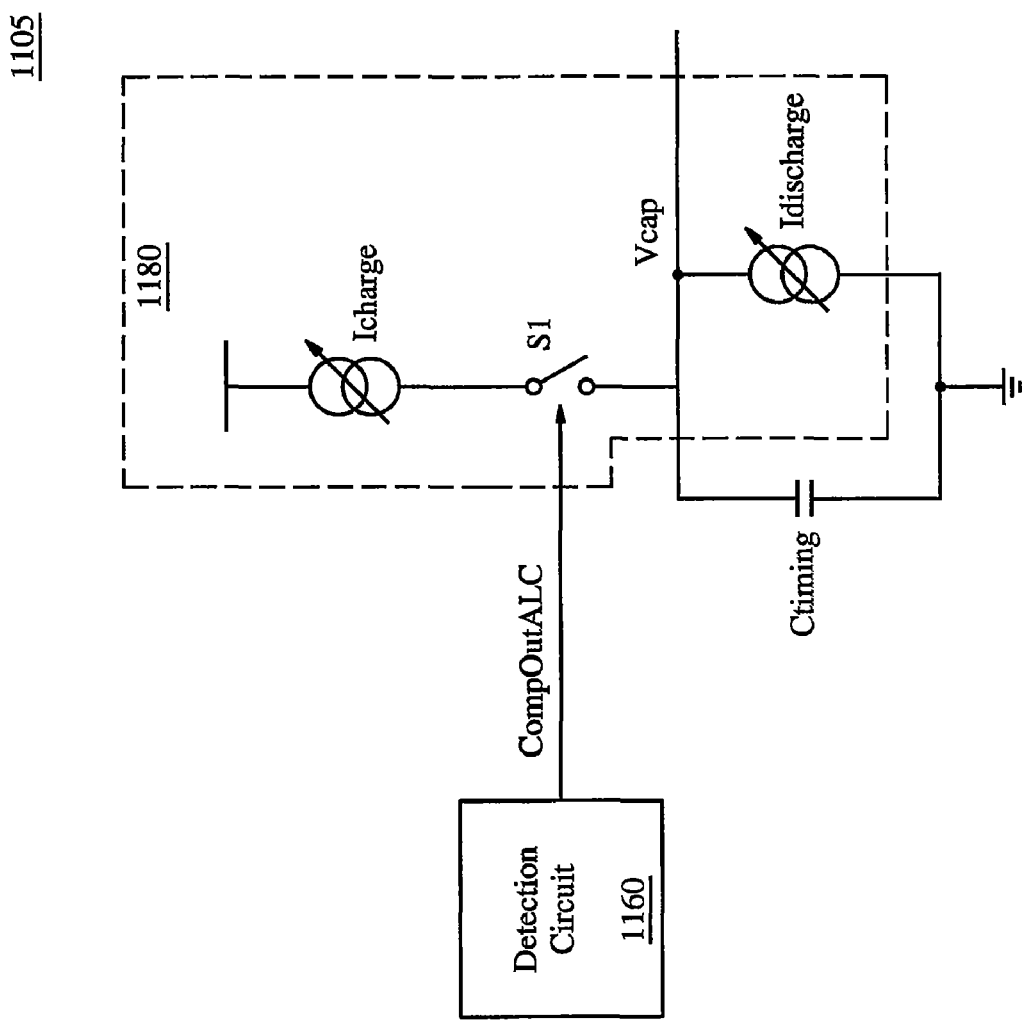
FIG. 11 illustrates a block diagram of a portion of the circuit of FIG. 9, arranged in accordance with aspects of the invention.

FIG. 11 illustrates a block diagram of a portion 1105 of an embodiment of circuit 900 of FIG. 9. Portion 1105 includes detection circuit 1160, charging circuit 1180, and timing capacitor Ctiming. Charging circuit 1180 includes current source Icharge, current source Idischarge, and switch S1. Current Icharge is greater than current Idischarge. Switch S1 is arranged to be closed when signal compOutALC is asserted, and to be open when signal compOutALC is not asserted, so that signal Icharge is provided to timing capacitor Ctiming when signal compOutALC is asserted. When switch S1 is open, timing capacitor Ctiming is discharged by current Idischarge. When switch S2 is closed, capacitor Ctiming is charged by a total current of Icharge-Idischarge.

In one embodiment, control voltage generator circuit 980 generates voltage VC from Vcap according to the following equation: VC=VDD/2−0.84*Vcap−$V_{dc\_bias}$. The value 0.84 is a value based on design trade-off between attack time and release time, and may be modified by the desired trade-off accordingly. In its quiescent state, $V_{cap}=V_{in}=0V$ and VC=0.5VDD−$V_{dc\_bias}$(<|$V_{thp}$|). [$V_{dc\_bias}$ is affected by process and temperature. The purpose of $V_{dc\_bias}$ is to control attack time and release time. This implies $V_{SGQ}=V_{dc\_bias}$]. Once the quantity 0.84$V_{cap}$+$V_{dc\_bias}$>|$V_{thp}$|, transistors M1 and M2 turn on. Initially as $V_{cap}$ increases from 0V, the transistor starts in the subthreshold region and transitions to the linear region (i.e., triode region). In the subthreshold region, a small current flows through transistor M1 and M2 having a minimal affect on the signal path gain. When transistors M1 and M2 enter the triode region, 0.84$V_{cap}$+$V_{dc\_bias}$>|$V_{thp}$|. At this point, the resistance of PMOS is a strong function of the amount of overdrive (Vod=0.84$V_{cap}$+$V_{dc\_bias}$−|$V_{thp}$|), and the current is proportional to Vin. As $V_{cap}$ continues to increase beyond this point, the resistance decreases further allowing a larger amount of current to flow through transistor M1 and M2. Beyond a certain $V_{cap}$ value, the gate voltage goes to zero and does not continue to diminish. This is the maximum attenuation point for VCA 901.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for automatic level control, comprising:
   an amplifier, including:
   a variable resistance circuit that is arranged to provide a variable equivalent resistance between a first node and a second node, wherein the variable resistance circuit has a control input, and wherein the variable resistance circuit is arranged to vary the variable resistance based on a control signal provided at the control input;
a first resistance circuit that is arranged to provide a first fixed equivalent resistance between a first input node and the first node, wherein the first resistance circuit is at least approximately a linear element;
a second resistance circuit that is arranged to provide a second fixed equivalent resistance between the first input node and a first op amp node, wherein the second resistance circuit is at least approximately another linear element; and
an op amp having at least a first input that is coupled to the first op amp node; and
an automatic level control circuit that is arranged to receive an automatic level control circuit input signal, and further arranged to adjust the variable resistance circuit based, in part, on the automatic level input signal, wherein the amplifier is arranged to provide an amplifier output signal, and wherein the automatic level control circuit input signal is based, at least in part, on the amplifier output signal.

2. The circuit of claim 1, wherein
the second node is coupled to a fixed voltage level.

3. The circuit of claim 1, wherein
the first resistance circuit consists of one of a first resistor, or two or more resistors coupled in series and/or in parallel to provide the first fixed equivalent resistance, and wherein the second resistance circuit consists of one of a second resistor, or two or more resistors coupled in series and/or in parallel to provide the second fixed equivalent resistance.

4. A circuit for automatic level control, comprising:
an amplifier, including:
a variable resistance circuit that is arranged to provide a variable equivalent resistance between a first node and a second node, wherein the variable resistance circuit has a control input, and wherein the variable resistance circuit is arranged to vary the variable resistance based on a control signal provided at the control input;
a first resistance circuit that is arranged to provide a first fixed equivalent resistance between a first input node and the first node, wherein the first resistance circuit is at least approximately a linear element;
a second resistance circuit that is arranged to provide a second fixed equivalent resistance between the first input node and a first op amp node, wherein the second resistance circuit is at least approximately another linear element;
an op amp having at least a first input that is coupled to the first op amp node;
a third resistance circuit that is coupled between the first input node and a third node; and
another variable resistance circuit that is coupled between the first input node and the second node.

5. The circuit of claim 4, further comprising:
an automatic level control circuit that is arranged to receive an automatic level control circuit input signal, and further arranged to adjust the variable resistance circuit based, in part, on the automatic level input signal, wherein the amplifier is arranged to provide an amplifier output signal, and wherein the automatic level control circuit input signal is based, at least in part, on the amplifier output signal.

6. The circuit of claim 1, wherein
the automatic level control circuit is arranged to control a gain of the amplifier through negative feedback such that the gain remains below a reference level.

7. The circuit of claim 1, wherein
the automatic level control circuit includes:
a detection circuit that is arranged to determine whether the amplifier output signal exceeds a reference level, and to assert a detection output signal based on the comparison if it is determined that the amplifier output signal exceeds the reference level;
a charging circuit that is arranged to control charging of a timing capacitor such that a timing capacitor voltage ramps when the detection output signal is asserted;
a control signal generator circuit that is arranged to provide a control signal based, in part, on the timing capacitor voltage.

8. A circuit for automatic level control, comprising:
an amplifier, including:
a variable resistance circuit that is connected between a first node and a second node;
a first resistance circuit that is connected between a first input node and the first node, wherein the first resistance circuit is at least approximately a linear element;
a second resistance circuit that is connected between the first input node and a first op amp node, wherein the second resistance circuit is at least approximately another linear element; and
an op amp having at least a first input that is connected to the first op amp input node; and
an automatic level control circuit that is arranged to receive an automatic level control circuit input signal, and further arranged to adjust a resistance that is associated with the variable resistance circuit based, in part, on the automatic level input signal, wherein the amplifier is arranged to provide an amplifier output signal, and wherein the automatic level control circuit input signal is based, at least in part, on the amplifier output signal.

9. The circuit of claim 8, wherein
the second node is connected to a fixed voltage level.

10. The circuit of claim 8, wherein
the first resistance circuit consists of one of a first resistor, of two or more resistors coupled in series and/or in parallel to provide an equivalent first resistance, and wherein the second resistance circuit consists of one of a second resistor, or two or more resistors coupled in series and/or in parallel to provide an equivalent second resistance.

11. A circuit for automatic level control, comprising:
an amplifier, including:
a variable resistance circuit that is connected between a first node and a second node;
a first resistance circuit that is connected between a first input node and the first node, wherein the first resistance circuit is at least approximately a linear element;
a second resistance circuit that is connected between the first input node and a first op amp node, wherein the second resistance circuit is at least approximately another linear element;
an op amp having at least a first input that is connected to the first op amp input node;
a third resistance circuit that is connected between the first input node and a third node; and
another variable resistance circuit that is connected between the first input node and the second node.

12. The circuit of claim 8, wherein
the variable resistance circuit is configured to operate substantially as a linear element.

13. The circuit of claim 12, wherein
the variable resistance circuit includes at least one transistor configured to operate in a triode region of operation.

14. The circuit of claim 11, further comprising:
an automatic level control circuit that is arranged to receive an automatic level control circuit input signal, and further arranged to adjust a resistance that is associated with the variable resistance circuit based, in part, on the automatic level input signal, wherein the amplifier is arranged to provide an amplifier output signal, and wherein the automatic level control circuit input signal is based, at least in part, on the amplifier output signal.

15. The circuit of claim 8, wherein
the automatic level control circuit is arranged to control a gain of the amplifier through negative feedback such that the gain remains below a reference level.

16. The circuit of claim 8, wherein
the automatic level control circuit includes:
- a detection circuit that is arranged to determine whether amplifier output signal exceeds a reference level, and to assert a detection output signal based on the comparison if it is determined that the amplifier output signal exceeds the reference level;
- a charging circuit that is arranged to control charging of a timing capacitor such that a timing capacitor voltage ramps when the detection output signal is asserted;
- a control signal generator circuit that is arranged to provide a control voltage based, in part, on the timing capacitor voltage, wherein variable resistance circuit is arranged such that a resistance associated with the variable resistance circuit is controlled based on the control voltage.

17. A method for automatic level control, comprising:
controlling a variable resistance between a first and a second node;
providing a first fixed equivalent resistance between a first input node and the first node; and
providing a second equivalent resistance between the first input node and a first op amp node that is coupled to a first input of an op amp, wherein
the variable resistance, first fixed equivalent resistance, the second equivalent resistance, and the op amp form at least a portion of an amplifier, wherein the variable resistance is controlled based, at least in part, on an amplifier output signal provided by the amplifier.

18. The method of claim 17, wherein
the amplifier has a gain; and
controlling the variable resistance is performed such that the gain is controlled through negative feedback such that the gain remains below a reference level.

19. The method of claim 17, wherein
controlling the variable resistance includes:
- making a determination as to whether the amplifier output signal exceeds a reference level;
- ramping a timing voltage when it is determined that the amplifier output signal exceeds the reference level;
- providing a control signal based, in part, on the timing voltage; and
- employing the control signal to control the variable resistance.

* * * * *

UNITED STATES PATENT AND TRADEMARK OFFICE
CERTIFICATE OF CORRECTION

PATENT NO. : 8,030,996 B1  
APPLICATION NO. : 12/572972  
DATED : October 4, 2011  
INVENTOR(S) : Jose Prado Page 1 of 1

It is certified that error appears in the above-identified patent and that said Letters Patent is hereby corrected as shown below:

In column 4, line 42, delete " $I_{PMOS(triode)} = p_p * [(V_{SG} - |V_{thp}|) * V_{SD} - V_{SD}^2] \cdot$ " and insert -- $I_{PMOS(triode)} = \beta_p * [(V_{SG} - |V_{thp}|) * V_{SD} - V_{SD}^2] \cdot$ --, therefor.

In column 6, line 37, delete " $|V_{dc\_bias}$ " and insert -- $V_{dc\_bias}$ --, therefor.

In column 6, line 39, delete " $V_{SGO} = V_{dc\_bias}] \cdot$ " and insert -- $V_{SGO} = V_{dc\_bias} \cdot$ --, therefor.

Signed and Sealed this  
Twenty-ninth Day of November, 2011

David J. Kappos  
*Director of the United States Patent and Trademark Office*